(12) United States Patent
Kang et al.

(10) Patent No.: US 9,128,377 B2
(45) Date of Patent: Sep. 8, 2015

(54) METHOD FOR FORMING GRAPHENE PATTERN

(71) Applicant: Samsung Display Co., Ltd., Yongin, Gyeonggi-Do (KR)

(72) Inventors: Sung-Ku Kang, Yongin (KR); Byeong-Kyu Jeon, Yongin (KR); Jung-Yun Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/911,374

(22) Filed: Jun. 6, 2013

(65) Prior Publication Data

US 2014/0212818 A1 Jul. 31, 2014

(30) Foreign Application Priority Data

Jan. 29, 2013 (KR) .................. 10-2013-0010001

(51) Int. Cl.
*G03F 7/20* (2006.01)

(52) U.S. Cl.
CPC ........................... *G03F 7/20* (2013.01)

(58) Field of Classification Search
CPC ........................................... G03F 7/20
USPC .................... 430/322, 325; 977/734
See application file for complete search history.

(56) References Cited

U.S. PATENT DOCUMENTS

| | | | | |
|---|---|---|---|---|
| 2002/0187419 A1* | 12/2002 | Dammel et al. | ........... | 430/270.1 |
| 2005/0159070 A1* | 7/2005 | Banba et al. | ........... | 445/24 |
| 2006/0009038 A1* | 1/2006 | Cohen et al. | ........... | 438/697 |
| 2008/0278068 A1* | 11/2008 | Huang et al. | ........... | 313/504 |
| 2012/0161106 A1* | 6/2012 | Kim et al. | ........... | 257/29 |
| 2012/0168723 A1 | 7/2012 | Park | | |
| 2013/0051535 A1* | 2/2013 | Davis et al. | ........... | 378/161 |
| 2014/0128551 A1* | 5/2014 | Shukla et al. | ........... | 525/327.1 |

FOREIGN PATENT DOCUMENTS

| | | | |
|---|---|---|---|
| KR | 10-1006488 A | 9/2010 | |
| KR | 1020110054386 A | 5/2011 | |
| KR | 1020110090398 A | 8/2011 | |
| KR | 10-2012-0009323 A | 2/2012 | |
| KR | 1020120012271 A | 2/2012 | |
| KR | 10-2012-0076297 A | 7/2012 | |
| KR | 10-2012-0078639 A | 7/2012 | |

* cited by examiner

*Primary Examiner* — Brittany Raymond
(74) *Attorney, Agent, or Firm* — Robert E. Bushnell, Esq.

(57) ABSTRACT

There is provided a method for forming a graphene pattern, in which a graphene thin film layer is transferred onto a surface of a photosensitive film, and then patterned through exposure/development of the photosensitive film. The photosensitive film is cured after being finally developed, thereby securing stability and reliability.

10 Claims, 7 Drawing Sheets

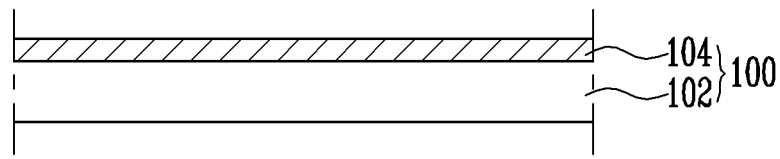
FIG. 3A
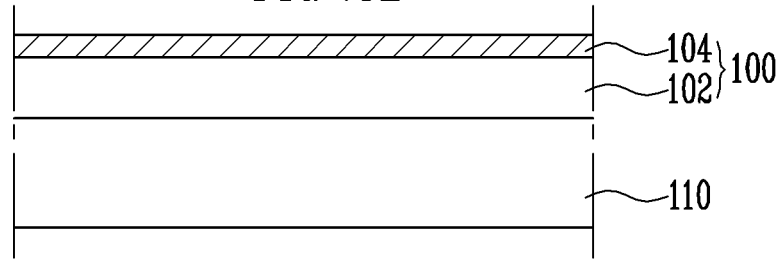
FIG. 3B
FIG. 3C
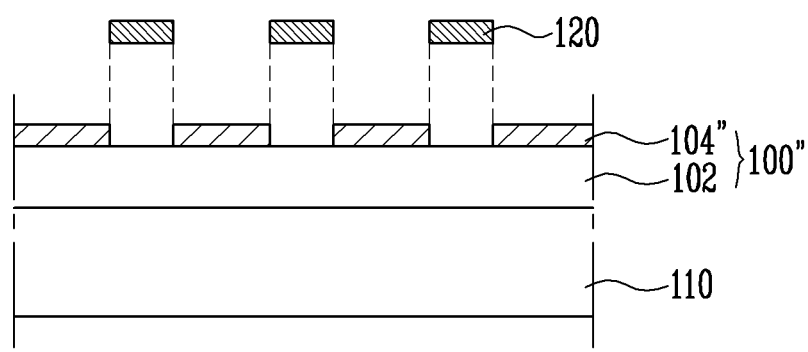

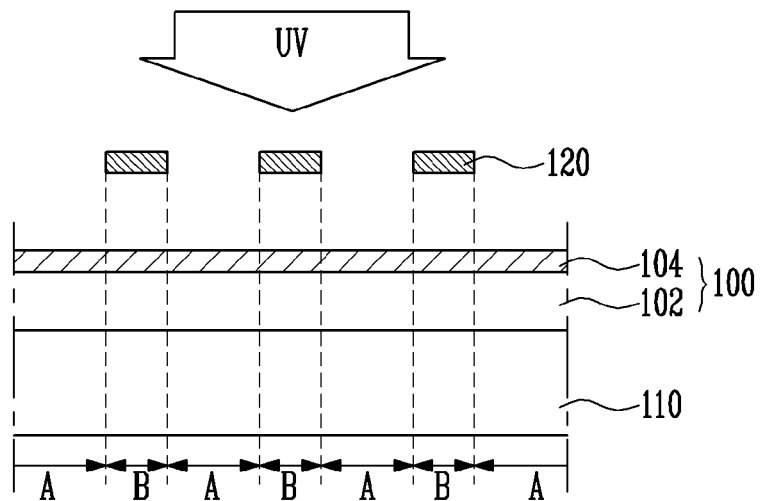
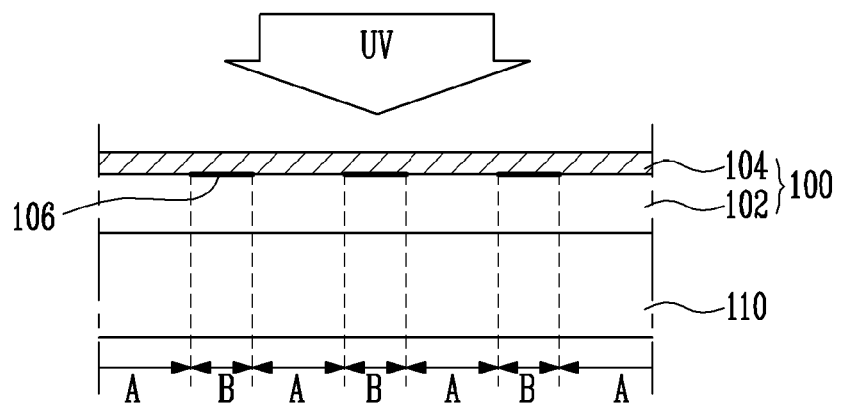
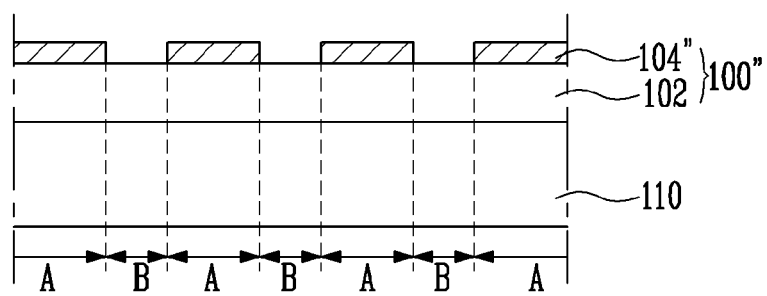

METHOD FOR FORMING GRAPHENE PATTERN

CLAIM OF PRIORITY

This application claims priority to and the benefit of Korean Patent Application No. 10-2013-0010001, filed on Jan. 29, 2013, in the Korean Intellectual Property Office, the entire content of which is incorporated herein by reference.

BACKGROUND OF THE INVENTION

1. Field of the Invention

An aspect of the present invention relates to a method for forming a graphene pattern, and more particularly, to a method for forming a graphene pattern using a transfer photolithography process.

2. Description of the Related Art

Graphene is a material that forms a honeycomb-shaped two-dimensional planar structure in which carbons are connected to one another in a hexagonal shape, and has high stability. In addition, the graphene has electrical conductivity 100 more times superior to silicon, and is flexible and transparent. Hence, studies on the graphene have been conducted in various fields.

Recently, studies on a method forming a thin film using the graphene have been actively conducted. A method of forming a micro-pattern of graphene is necessarily developed in order to produce the graphene as a substantially commercial product. However, the development of the method has not been completed.

A chemical patterning method using exposure should be applied to form a micro-pattern of graphene, but there exists no echant solution for etching the graphene due to the chemically stable characteristic of the graphene.

Accordingly, a physical dry etching or imprinting method was conventionally applied to form a micro-pattern of graphene. However, it is possible to implement the micro-pattern of the graphene using the method.

SUMMARY OF THE INVENTION

Embodiments provide a method for forming a graphene pattern, in which a graphene thin film layer is transferred onto a surface of a photosensitive film and then patterned through exposure/development of the photosensitive film, and the photosensitive film is cured after being finally developed, thereby securing stability and reliability.

According to an aspect of the present invention, there is provided a method for forming a graphene pattern, including: transferring a graphene thin film layer onto a surface of a photosensitive film; transferring and attaching, to a substrate, the photosensitive film having the graphene thin film layer formed on the surface thereof; and placing a mask having a predetermined pattern implemented therein above the graphene thin film layer, and patterning the graphene thin film layer through a photolithography process.

The graphene thin film layer may be implemented by depositing carbon on a metal substrate, cooling the metal substrate having the carbon deposited thereon and then removing the metal substrate.

The graphene thin film layer may be implemented by mixing at least one of CNT (carbon nano tube), AgNW (Ag nano-wire) and PEDOT-PSS (poly(3,4-ethylene di oxy thiophene):poly(styrene-sulfonate)) as another conductive material with graphene in the formation of the graphene thin film layer.

The photosensitive film may be implemented as a dry photosensitive film. The thickness of the photosensitive film may be about 1 to 5 μm. The photosensitive film may be implemented as a negative-type photosensitive film.

The photolithography process may include applying light through the mask having the predetermined pattern implemented therein; and developing the photosensitive film so that the photosensitive film corresponding to a region except a region of the photosensitive film cured through the exposure process, and simultaneously patterning the photosensitive film and the graphene thin film layer formed on an upper surface thereof.

The photolithography process may include applying light through the mask having the predetermined pattern implemented therein as a first exposure process; removing the mask and irradiating light onto the entire surface of the photosensitive film formed on the surface of the graphene thin film layer as a second exposure process; forming an oxygen inhibition layer on the upper surface of the photosensitive film corresponding to a region except a region of the photosensitive film cured through the first exposure process; and developing the photosensitive film so that the upper surface of the photosensitive film corresponding to the region contacting the oxygen inhibition layer is not cured but the uncured upper surface of the photosensitive film is removed, and selectively patterning only a region in which the oxygen inhibition layer is formed and the graphene thin film layer corresponding thereto.

The method may further include performing an ultraviolet (UV) curing process on the cured photosensitive film and the graphene thin film layer corresponding thereto after the developing process is completed.

As described above, according to the present invention, a graphene thin film layer formed as described above is transferred onto a surface of a photosensitive film and then patterned through exposure/development of the photosensitive film, and the photosensitive film is cured after being finally developed, thereby implementing a graphene micro-pattern capable of securing stability and reliability.

BRIEF DESCRIPTION OF THE DRAWINGS

The accompanying drawings, together with the specification, illustrate exemplary embodiments of the present invention, and, together with the description, serve to explain the principles of the present invention.

FIGS. 3A to 3C are process sectional views illustrating a method for forming a graphene pattern according to another embodiment of the present invention.

FIGS. 4A to 4D are process sectional views illustrating in detail a process shown in FIG. 3C.

DETAILED DESCRIPTION

Figure 1A:
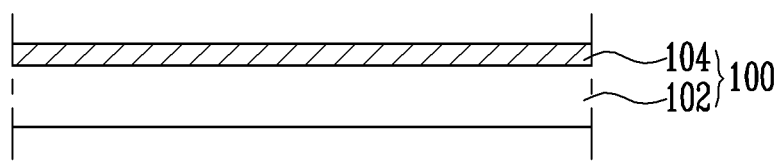
FIGS. 1A to 1C are process sectional views illustrating a method for forming a graphene pattern according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Graphene is a material that forms a honeycomb-shaped two-dimensional planar structure in which carbons are connected to one another in a hexagonal shape. The graphene may be used as a transparent conductive layer having high electron mobility.

The graphene may be formed as a graphene thin film layer using various methods. For example, the graphene thin film layer may be formed by depositing carbon on a metal substrate such as nickel or copper, cooling the metal substrate having the carbon deposited thereon and then removing the metal substrate.

In an embodiment of the present invention, a graphene thin film layer formed as described above is transferred onto a surface of a photosensitive film and then patterned through exposure/development of the photosensitive film, and the photosensitive film is cured after being finally developed, thereby implementing a graphene micro-pattern capable of securing stability and reliability.

Figure 1B:
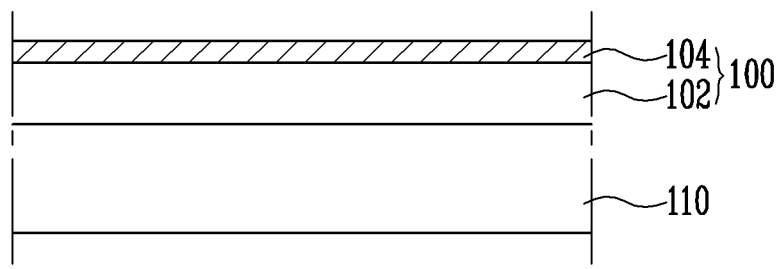
Figure 1C:
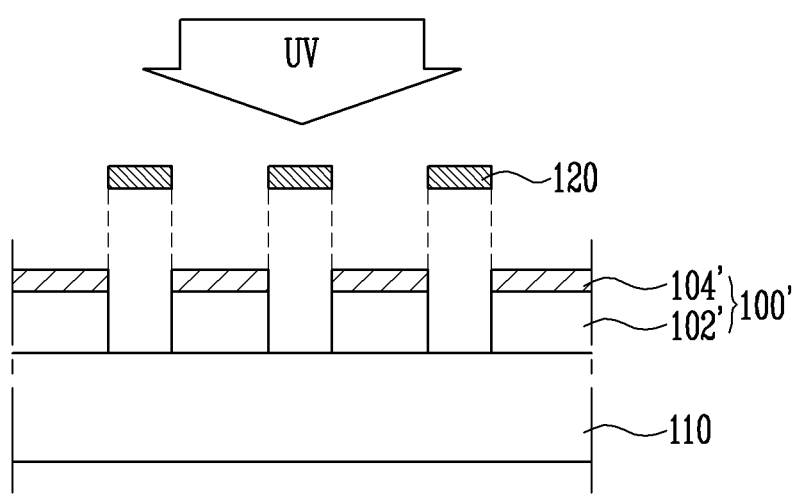
Figure 5:
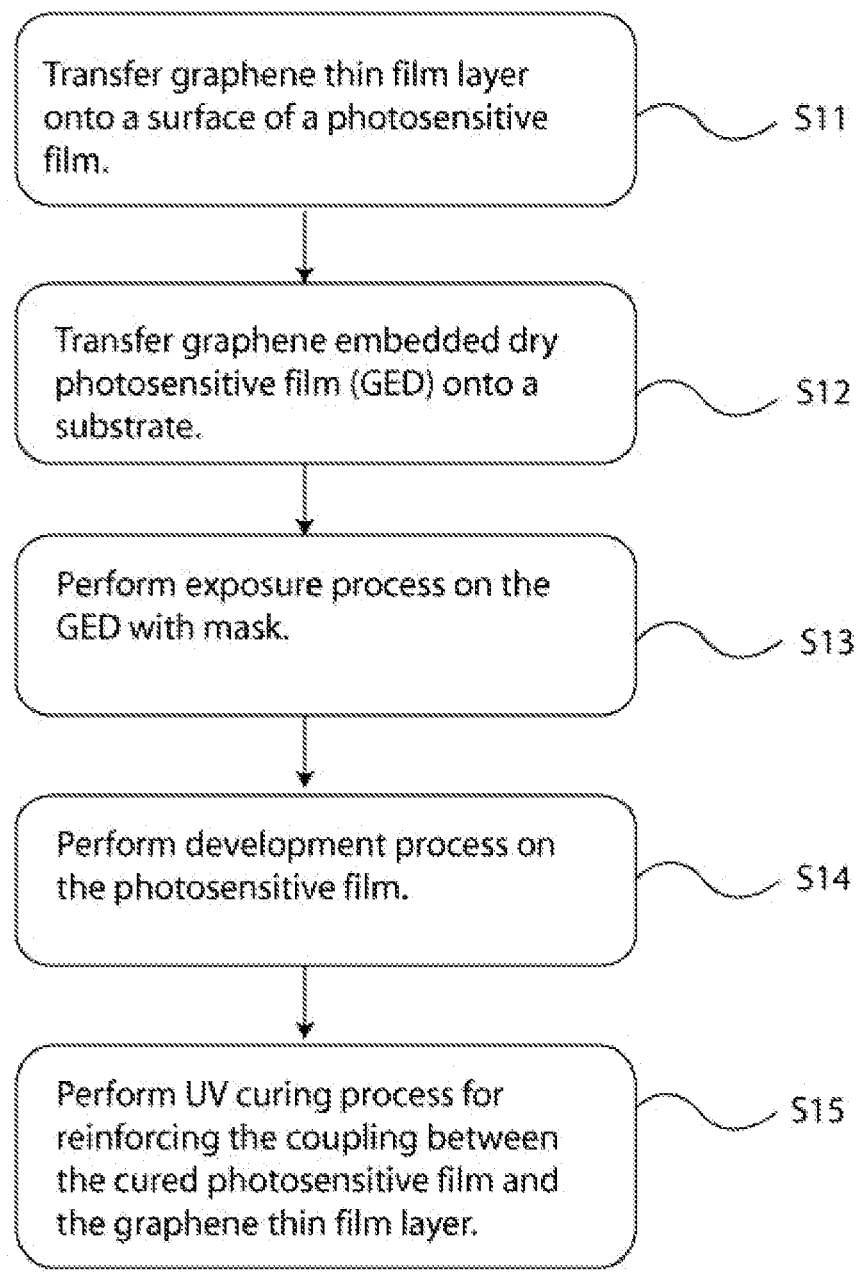
FIG. 5 shows a flowchart presenting the embodiment shown in FIGS. 1A through 3C.

FIGS. 1A to 1C are process sectional views illustrating a method for forming a graphene pattern according to an embodiment of the present invention. FIG. 5 shows a flowchart presenting the embodiment shown in FIGS. 1A through 3C.

First, referring to FIG. 1A, a graphene thin film layer 104 is transferred onto a surface of a photosensitive film 102 (S11).

In this case, the graphene thin film layer 104, as described above, may be formed by depositing carbon on a metal substrate such as nickel or copper, cooling the metal substrate having the carbon deposited thereon and then removing the metal substrate.

The photosensitive film 102 may be implemented as a dry photosensitive film. Hereinafter, the dry photosensitive film having the graphene thin film layer formed on a surface thereof is defined as a graphene embedded dry photosensitive film (GED) 100.

Subsequently, as shown in FIG. 1B, the GED 100 is transferred onto a substrate 110 and then attached to the substrate 110 (S12). In this case, the GED 110 may be attached to the substrate 110 using a lamination technique.

That is, the GED 100 is placed on the substrate 110, and a protective film (not shown) is attached on the GED 100. Then, the GED 100 is attached to the substrate 110 using a lamination roller. In this case, the protective film may be removed during a photolithography process described later.

The substrate 110 is a transparent substrate, and may be implemented as a glass substrate or a polyimide (PI) substrate having flexibility.

Subsequently, referring to FIG. 1C, a mask 120 having a predetermined pattern implemented therein is placed above the GED 100, and a photolithography process, i.e., an exposure and development process is performed using the mask 120, thereby performing a patterning process on the graphene thin film layer 104 on a surface of the GED 100.

That is, a graphene thin film layer 104' and a photosensitive film 102', in which a predetermined pattern is formed as a GED 100' patterned using the photolithography process, are shown in FIG. 1C.

Because of the chemically stable characteristic of graphene, a physical process, i.e., a dry etching process was used for patterning of the graphene. However, it is difficult to implement a micro-pattern of the graphene through the physical process.

On the other hand, in this embodiment, as shown in FIGS. 1A to 1C, the graphene thin film layer 104 is transferred onto the photosensitive film 102, and the photolithography process is performed on the photosensitive film 102, thereby implementing a micro-pattern of the graphene thin film layer 104.

In this case, the thickness of the photosensitive film 102 may be about 1 to 5 µm. However, the thickness of the photosensitive film 102 may be changed depending on an application used. Generally, in a mobile application, the thickness of the photosensitive film 102 is within 5 µm, which is advantageous in terms of visibility.

FIG. 1C illustrates the GED pattern 104' formed by performing the photolithography process, i.e., the exposure and development process on the GED 100. Detailed processes of the photolithography process are not shown in FIG. 1C.

Figure 2A:
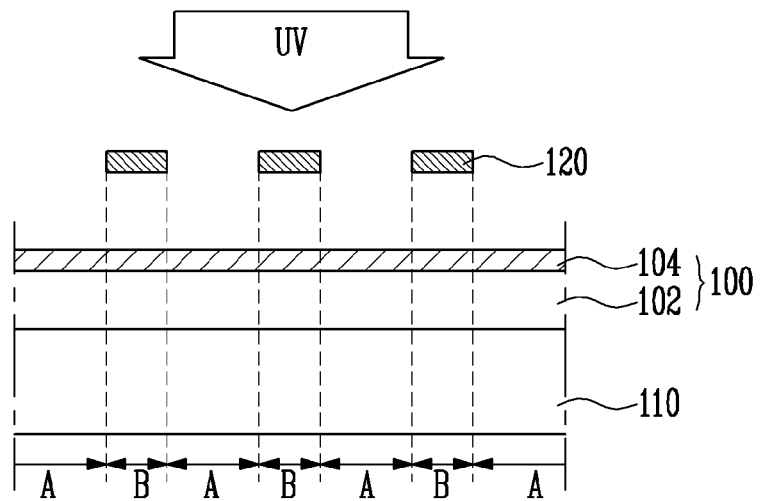
FIGS. 2A to 2C are process sectional views illustrating in detail a process shown in FIG. 1C.
Figure 2B:
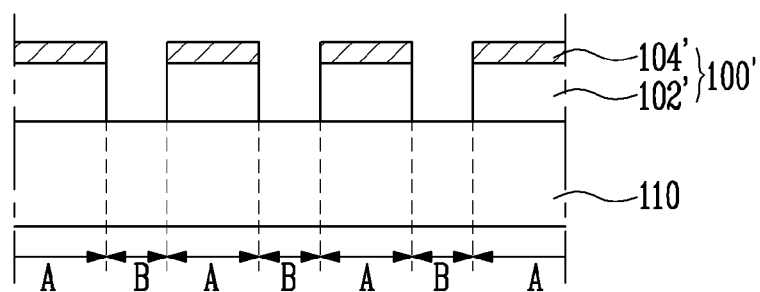
Figure 2C:
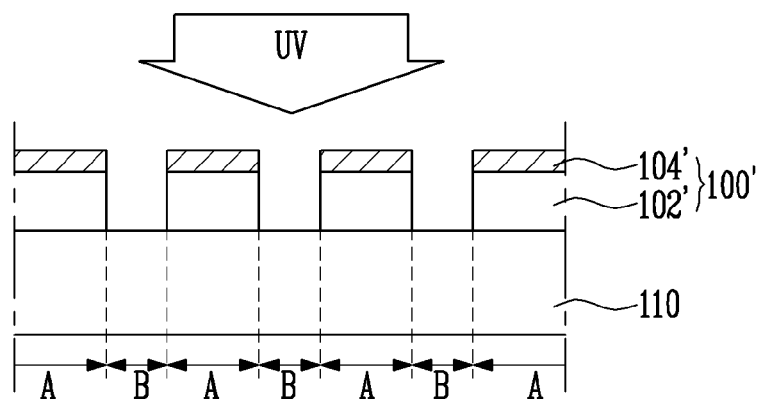

FIGS. 2A to 2C are process sectional views illustrating in detail a process shown in FIG. 1C. Processes of patterning the GED will be described with reference to FIGS. 2A to 2C.

First, referring to FIG. 2A, the mask 120 having a predetermined pattern implemented therein is placed above the GED 100 attached to the substrate 110, and a light source such as ultraviolet (UV) is applied onto the mask 120, thereby performing an exposure process on the GED 100 (S13). More specifically, the exposure process is performed on the photosensitive film 102 by light transmitted through the graphene thin film layer 104.

The photosensitive film 102 may be implemented as a negative-type photosensitive film. In this case, a region A of the photosensitive film 102, which receives light through the exposure process, is cured.

After the exposure process is performed, a development is performed as shown in FIG. 2B. In a case where the GED 100 is attached to the substrate 110 using the lamination technique, the protective film (not shown) attached on the GED 100 before the development process may be removed.

Referring to FIG. 2B, the development process is performed on the photosensitive film (S14) so that the photosensitive film corresponding to a region B, except the region A cured through the exposure process, is removed. Accordingly, the photosensitive film and the graphene thin film layer formed on an upper surface thereof are patterned together.

That is, as shown in this figure, the graphene thin film layer 104' and the photosensitive film 102', in which a predetermined pattern is formed, is implemented as the GED 100' through the development process.

This is because as the photosensitive film corresponding to the region B, except the cured region A, is removed by a developing solution, the graphene thin film layer formed on the corresponding region B is also removed.

Since the graphene thin film layer has an ultimately small thickness, the graphene thin film layer is more easily removed. The graphene thin film layer may be implemented by mixing another conductive material, e.g., CNT, AgNW, PEDOT-PSS, etc. with the graphene in the formation of the graphene thin film layer, as long as the thickness of the graphene thin film layer is maintained.

As such, a graphene thin film layer or graphene mixed thin film layer is transferred onto a photosensitive film, and a photolithography process is performed on the photosensitive film, thereby implementing a micro-pattern of the graphene.

Although not shown in this figure, the photosensitive film and the graphene thin film layer corresponding thereto, which are not removed in the development process but remain, are removed through a separate stripping or ashing process, thereby completing the patterning process.

As shown in FIG. 2C, a UV curing process for reinforcing the coupling between the cured photosensitive film 102' and the graphene thin film layer 104' corresponding thereto may be further performed (S15) after the development process is completed.

Figure 6:
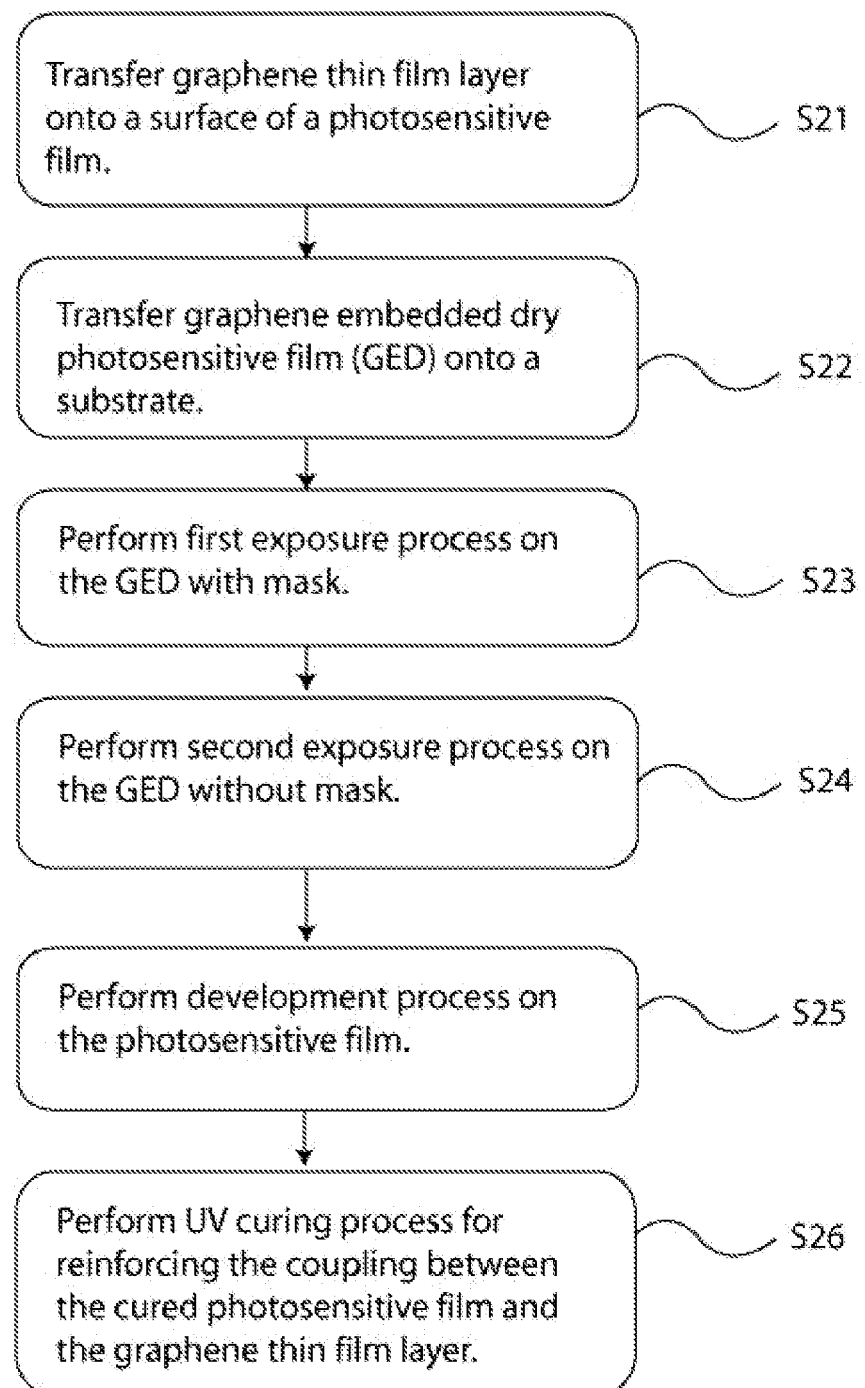
FIG. 6 shows a flowchart presenting another embodiment shown in FIGS. 3A through 4D.

FIGS. 3A to 3C are process sectional views illustrating a method for forming a graphene pattern according to another embodiment of the present invention. FIG. 6 shows a flowchart presenting another embodiment shown in FIGS. 3A through 4D.

The embodiment of FIG. 3 is different from the embodiment of FIG. 1 in that the surface of the GED, i.e., only the graphene thin film layer rather than the photosensitive film is patterned. Therefore, components identical to those of FIG. 1 are designated by like reference numerals, and their detailed descriptions will be omitted.

That is, like FIGS. 1A and 2B, in FIGS. 3A and 3B, a graphene thin film layer 104 is transferred onto a surface of a photosensitive film 102 (FIG. 3A and step S21), and the photosensitive film 102 having the graphene thin film layer 104 transferred thereonto, i.e., a GED 100 is transferred onto a substrate 110. Then, the GED 100 is attached to the substrate 110 (FIG. 3B and step S22).

Subsequently, referring to FIG. 3C, a mask 120 having a predetermined pattern implemented therein is placed above the GED 100, and a photolithography process, i.e., an exposure and development process is performed using the mask 120, thereby performing a patterning process on the graphene thin film layer 104 on a surface of the GED 100.

FIG. 3C is different from FIG. 1C in that the patterning process is not performed on the photosensitive film but performed on only the graphene thin film layer formed on the surface of the photosensitive film.

That is, a graphene thin film layer 104" in which a predetermined pattern is formed as a GED 100" patterned through the photolithography process and the photosensitive film of which form is maintained as it is are shown in FIG. 3C.

Detailed processes of FIG. 3C will be described with reference to FIGS. 4A to 4C.

First, referring to FIG. 4A, the mask 120 having a predetermined pattern implemented therein is placed above the GED 100 attached to the substrate 110, and a light source such as UV is applied onto the mask 120, thereby performing a first exposure process on the GED 100 (S23). More specifically, the exposure process is performed on the photosensitive film 102 by light transmitted through the graphene thin film layer 104.

The photosensitive film 102 may be implemented as a negative-type photosensitive film. In this case, a region A of the photosensitive film 102, which receives light through the exposure process, is cured.

In a case where the GED 100 is attached to the substrate 110 using the lamination technique, a protective film (not shown) attached on the GED 100 before the first exposure process may be removed.

Subsequently, referring to FIG. 4B, a second exposure process of removing the mask 120 and irradiating the entire surface of the GED 100 with the light such as UV is performed (S24).

That is, the second exposure process is performed without any mask, and accordingly, the entire photosensitive film 102 is exposed.

In this case, the photosensitive film 102 is implemented as a negative-type photosensitive film. Therefore, the entire photosensitive film 102 is necessarily cured.

However, if the second exposure process is performed as described above, an oxygen inhibition layer 106 is formed on an upper surface of the photosensitive film corresponding to a region B except the region A cured through the first exposure process, i.e., an interface between the photosensitive film and the graphene thin film layer.

The oxygen inhibition layer 106 prevents the photosensitive film corresponding to the region B contacting the oxygen inhibition layer 106 from reacting with oxygen or another gas, and allows the upper surface of the photosensitive film not to be cured by the exposure.

Thus, although the second exposure process is performed, the upper surface of the photosensitive film contacting the oxygen inhibition layer 106, i.e., the upper surface of the photosensitive film corresponding to the region B except the region A cured through the first exposure process is not cured by the oxygen inhibition layer 106.

That is, most of the photosensitive layer is cured through the first and second exposure processes, but only the upper surface of the photosensitive film corresponding to the region B first exposed in the second exposure process is not cured by the oxygen inhibition layer 106.

Accordingly, as shown in FIG. 4C, the photosensitive film is developed (S25) so that the upper surface of the photosensitive film corresponding to the region B first exposed in the second exposure process is removed after the second exposure process. As a result, a selective patterning process can be performed on only a region in which the oxygen inhibition layer 106 is formed and the graphene thin film layer corresponding to the region.

That is, a graphene thin film layer 104" in which a predetermined pattern is formed as a GED 100" patterned through the photolithography process and the photosensitive film of which form is maintained as it is are shown in FIG. 4C.

Since the graphene thin film layer has an ultimately small thickness, the graphene thin film layer is more easily removed. The graphene thin film layer may be implemented by mixing another conductive material, e.g., CNT, AgNW, PEDOT-PSS, etc. with the graphene in the formation of the graphene thin film layer, as long as the thickness of the graphene thin film layer is maintained.

As shown in FIG. 4C, a UV curing process for reinforcing the coupling between the cured photosensitive film and the graphene thin film layer corresponding thereto may be further performed after the development process is completed.

Figure 4D:
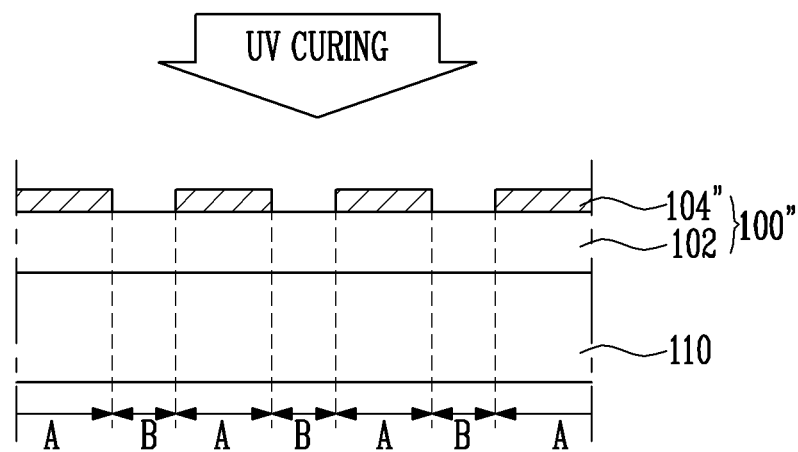

As shown in FIG. 4D, a UV curing process for reinforcing the coupling between the cured photosensitive film 102' and the graphene thin film layer 104' corresponding thereto may be further performed (S26) after the development process is completed.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method for forming a graphene pattern, comprising:
    transferring a graphene thin film layer onto a surface of a photosensitive film;

transferring and attaching, to a substrate, the photosensitive film having the graphene thin film layer formed on the surface thereof; and placing a mask having a predetermined pattern implemented therein above the graphene thin film layer, and patterning the graphene thin film layer through a photolithography process.

2. The method of claim 1, wherein the graphene thin film layer is implemented by depositing carbon on a metal substrate, cooling the metal substrate having the carbon deposited thereon and then removing the metal substrate.

3. The method of claim 2, wherein the graphene thin film layer is implemented by mixing at least one of carbon nano tube (CNT), Ag nano-wire (AgNW) and poly(3,4-ethylene di 3 oxy thiophene):poly(styrene-sulfonate) (PEDOT-PSS) as another conductive material with graphene in the formation of the graphene thin film layer.

4. The method of claim 1, wherein the photosensitive film is implemented as a dry photosensitive film.

5. The method of claim 4, wherein the thickness of the photosensitive film is about 1 to 5 μm.

6. The method of claim 4, wherein the photosensitive film is implemented as a negative-type photosensitive film.

7. The method of claim 1, wherein the patterning the graphene thin film layer through the photolithography process comprising:

applying light to the graphene thin film layer through the mask having the predetermined pattern implemented therein, a region of the graphene thin film and the photosensitive film being exposed to the light, another region of the graphene thin film and the photosensitive film not being exposed to the light; and developing the photosensitive film to remove said another region of the graphene thin film and the photosensitive film from the substrate to form a pattern of the graphene thin film layer on the substrate.

8. The method of claim 7, further comprising applying ultraviolet light to said region of the graphene thin film and the photosensitive film being exposed to the light, after said developing the photosensitive film.

9. The method of claim 1, wherein the photolithography process comprising:

applying light through the mask having the predetermined pattern implemented therein as a first exposure process;

removing the mask and irradiating light onto the entire surface of the photosensitive film formed on the surface of the graphene thin film layer as a second exposure process;

forming an oxygen inhibition layer on the upper surface of the photosensitive film corresponding to a region except a region of the photosensitive film cured through the first exposure process; and developing the photosensitive film so that the upper surface of the photosensitive film corresponding to the region contacting the oxygen inhibition layer is not cured but the uncured upper surface of the photosensitive film is removed, and selectively patterning only a region in which the oxygen inhibition layer is formed and the graphene thin film layer corresponding thereto.

10. The method of claim 9, further comprising performing an UV curing process on the cured photosensitive film and the patterned graphene thin film layer after the developing process is completed.

* * * * *